United States Patent
Strader et al.

(10) Patent No.: US 10,453,773 B2
(45) Date of Patent: Oct. 22, 2019

(54) DEVICES FOR ABSORBING ENERGY FROM ELECTRONIC COMPONENTS

(71) Applicant: Laird Technologies, Inc., Earth City, MO (US)

(72) Inventors: Jason L. Strader, Cleveland, OH (US); Eugene Anthony Pruss, Avon Lake, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 15/873,131

(22) Filed: Jan. 17, 2018

(65) Prior Publication Data
US 2018/0182685 A1 Jun. 28, 2018

Related U.S. Application Data

(63) Continuation of application No. PCT/US2016/050905, filed on Sep. 9, 2016.
(Continued)

(51) Int. Cl.
*H01L 23/373* (2006.01)
*F28F 21/02* (2006.01)
(Continued)

(52) U.S. Cl.
CPC .......... *H01L 23/3735* (2013.01); *F28F 21/02* (2013.01); *F28F 21/06* (2013.01); *F28F 21/065* (2013.01); *H01L 23/552* (2013.01)

(58) Field of Classification Search
CPC . H01L 23/552; H01L 23/3672; H01L 23/427; F28F 2013/006; F28F 21/065; B23P 15/26; B32B 37/04
(Continued)

(56) References Cited

U.S. PATENT DOCUMENTS 5,781,412 A 7/1998 de Sorgo
5,830,809 A 11/1998 Howard et al.
(Continued)

FOREIGN PATENT DOCUMENTS

CN 102260466 A 11/2011
CN 1874889 9/2012
(Continued)

OTHER PUBLICATIONS

International Search Report and Written Opinion dated Dec. 15, 2016 for PCT Application No. PCT/US2016/050905 filed Sep. 9, 2016 which claims priority to the same parent application as the instant application, 10 pages.
(Continued)

*Primary Examiner* — Jonathan Han
(74) *Attorney, Agent, or Firm* — Harness, Dickey & Pierce, P.L.C.; Anthony G. Fussner

(57) ABSTRACT

A device for absorbing energy from an electronic component includes a low melting alloy layer including a first side and a second side opposing the first side, and coating layers substantially covering the first side and the second side of the low melting alloy layer. In some embodiments, the low melting alloy layer includes a polymer mixture and a plurality of low melting alloy particulates dispersed in the polymer mixture. Other example devices are also disclosed.

20 Claims, 7 Drawing Sheets

Related U.S. Application Data

(60) Provisional application No. 62/217,482, filed on Sep. 11, 2015.

(51) Int. Cl.
*F28F 21/06* (2006.01)
*H01L 23/552* (2006.01)

(58) Field of Classification Search
USPC ....... 165/185; 156/309.6; 257/717; 438/122; 361/679.54, 704
See application file for complete search history.

(56) References Cited

U.S. PATENT DOCUMENTS

| | | |
|---|---|---|
| 5,985,452 A | 11/1999 | Mercuri |
| 6,131,651 A | 10/2000 | Richey, III |
| 6,149,972 A | 11/2000 | Greinke |
| 6,245,400 B1 | 6/2001 | Tzeng et al. |
| 6,254,993 B1 | 7/2001 | Mercuri |
| 6,339,120 B1 | 1/2002 | Misra et al. |
| 6,482,520 B1 | 11/2002 | Tzeng |
| 6,503,626 B1 | 1/2003 | Norley et al. |
| 6,624,224 B1 | 9/2003 | Misra |
| 6,703,128 B2 | 3/2004 | Myers et al. |
| 6,706,219 B2 | 3/2004 | Nguyen |
| 6,791,839 B2 | 9/2004 | Bhagwagar |
| 6,797,758 B2 | 9/2004 | Misra et al. |
| 6,822,018 B2 | 11/2004 | Chaudhuri et al. |
| 6,841,250 B2 | 1/2005 | Tzeng |
| 6,841,867 B2 | 1/2005 | Matayabas, Jr. et al. |
| 6,926,955 B2 | 8/2005 | Jayaraman et al. |
| 6,946,190 B2 | 9/2005 | Bunyan |
| 6,982,874 B2 | 1/2006 | Smalc et al. |
| 6,984,685 B2 | 1/2006 | Misra et al. |
| 7,036,573 B2 | 5/2006 | Koning et al. |
| 7,074,490 B2 | 7/2006 | Feng et al. |
| 7,138,029 B2 | 11/2006 | Norley et al. |
| 7,147,367 B2 | 12/2006 | Balian et al. |
| 7,150,914 B2 | 12/2006 | Clovesko et al. |
| 7,160,619 B2 | 1/2007 | Clovesko et al. |
| 7,161,807 B2 | 1/2007 | Ishikawa et al. |
| 7,161,809 B2 | 1/2007 | Ford et al. |
| 7,166,912 B2 | 1/2007 | Tzeng et al. |
| 7,196,413 B2 | 3/2007 | Shibuya et al. |
| 7,235,301 B2 | 6/2007 | Bacher et al. |
| 7,276,273 B2 | 10/2007 | Clovesko et al. |
| 7,292,441 B2 | 11/2007 | Smalc et al. |
| 7,303,820 B2 | 12/2007 | Capp et al. |
| 7,306,847 B2 | 12/2007 | Capp et al. |
| 7,365,988 B2 | 4/2008 | Reis et al. |
| 7,385,819 B1 | 6/2008 | Shives et al. |
| 7,470,468 B2 | 12/2008 | Mercuri et al. |
| 7,473,995 B2 | 1/2009 | Rumer et al. |
| 7,498,376 B2 | 3/2009 | Myers et al. |
| 7,505,275 B2 | 3/2009 | Reis et al. |
| 7,573,717 B2 | 8/2009 | Reis et al. |
| 7,658,999 B2 | 2/2010 | Clovesko et al. |
| 7,666,270 B1 | 2/2010 | Smalc et al. |
| 7,799,428 B2 | 9/2010 | Fujiwara et al. |
| 7,889,502 B1 | 2/2011 | Reis et al. |
| 7,923,112 B2 | 4/2011 | Christ et al. |
| 8,211,260 B2 | 7/2012 | Norley et al. |
| 8,773,856 B2 | 7/2014 | Petroski |
| 8,920,707 B2 | 12/2014 | Lee et al. |
| 8,937,384 B2 | 1/2015 | Bao et al. |
| 9,343,784 B2 | 5/2016 | Wayne et al. |
| 2005/0045372 A1* | 3/2005 | Hill ..................... H01L 23/4275 174/252 |
| 2007/0042188 A1 | 2/2007 | Clovesko et al. |
| 2009/0117345 A1* | 5/2009 | Strader ................ B32B 37/025 428/195.1 |
| 2009/0117373 A1* | 5/2009 | Wisniewski ........ H01L 23/3735 428/336 |
| 2010/0073882 A1 | 3/2010 | Yoshikawa et al. |
| 2011/0038124 A1 | 2/2011 | Burnham et al. |
| 2011/0045300 A1 | 2/2011 | Tamaoki et al. |
| 2012/0061135 A1 | 3/2012 | Hill et al. |
| 2012/0187332 A1* | 7/2012 | Iruvanti ................. B82Y 30/00 252/73 |
| 2012/0234525 A1 | 9/2012 | Norley et al. |
| 2012/0263940 A1 | 10/2012 | Arzberger et al. |
| 2013/0264041 A1 | 10/2013 | Zhamu et al. |
| 2013/0265721 A1* | 10/2013 | Strader ................ H05K 7/2039 361/705 |
| 2013/0329366 A1 | 12/2013 | Wang et al. |
| 2014/0116661 A1 | 5/2014 | Xu et al. |
| 2014/0124176 A1 | 5/2014 | Zhamu et al. |
| 2014/0226284 A1 | 8/2014 | Yamauchi et al. |
| 2014/0239481 A1 | 8/2014 | Nguyen et al. |
| 2014/0261682 A1 | 9/2014 | Sorloaica et al. |
| 2014/0340873 A1 | 11/2014 | Chen |
| 2014/0345843 A1* | 11/2014 | Kirkor ................... F28F 23/00 165/185 |
| 2014/0368992 A1 | 12/2014 | Strader et al. |
| 2014/0374071 A1 | 12/2014 | Timmerman et al. |
| 2015/0077895 A1 | 3/2015 | Jindo et al. |
| 2015/0257251 A1 | 9/2015 | Kagawa |

FOREIGN PATENT DOCUMENTS

| | | |
|---|---|---|
| EP | 1472728 B1 | 9/2008 |
| JP | 2006332305 A | 12/2006 |
| JP | 5680097 B2 | 3/2015 |
| KR | 20090074772 A | 7/2009 |
| WO | WO-2015095107 A1 | 6/2015 |
| WO | WO-2015095271 A1 | 6/2015 |
| WO | WO-2016003468 A1 | 1/2016 |

OTHER PUBLICATIONS

Loctite TAF 8800 Thermal Absorbing Film, http://www.henkel-adhesives.com/product-search-1554.htm?nodeid=8802610348033, accessed Jul. 7, 2015, 1 page.

Novel nanocarbon-based, lightweight, flexible EMI shield, www.cvdmaterialscorporation.com, Feb. 2010, 1 page.

LOCTITE TAF-8800, Technical Data Sheet, www.henkel.com/electronics, Oct. 2012, 2 pages.

LOCTITE TAF Series, LOCTITE TAF Thermal Absorber, www.henkel.com/electronics, Copyright 2013, 2 pages.

Gaier, EMI Shields Made From Intercalated Graphite Composites, NASA Technical Memorandum 106979, Jun. 21-23, 1994, 16 pages.

Chung, D., Flexible Graphite for Gasketing, Adsorption, Electromagnetic Interference Shielding, Vibration Damping, Electrochemical Applications, and Stress Sensing, Journal of Materials Engineering and Performance, vol. 9(2) Apr. 2000, pp. 161-163.

Luo et al., Electromagnetic interference shielding reaching 130 dB using flexible graphite, Carbon vol. 34, No. 10, 1996, 2 pages.

Chung, D. Electromagnetic interference shielding effectiveness of carbon materials, Carbon 39 (2001) 279-285.

* cited by examiner

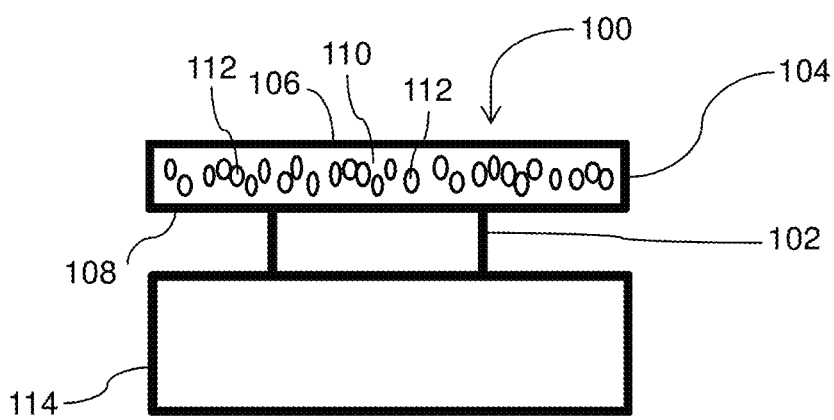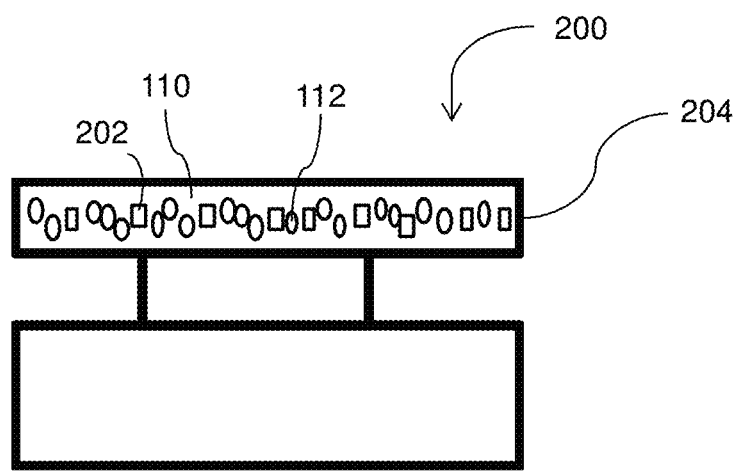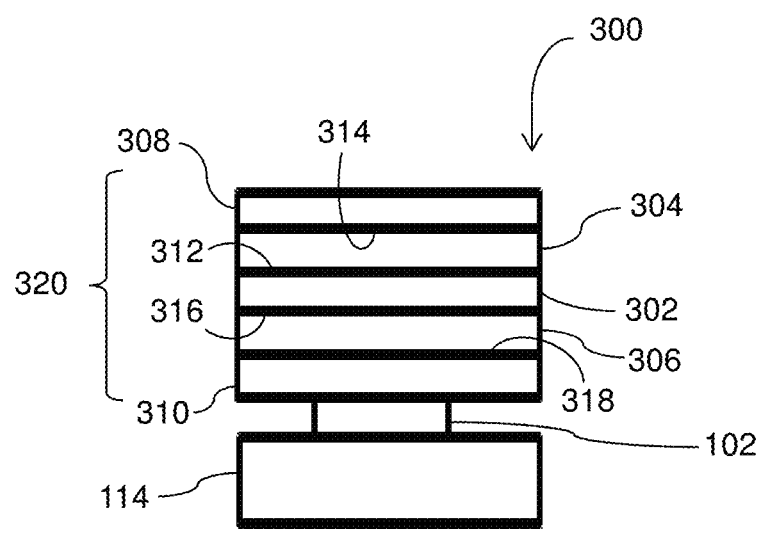

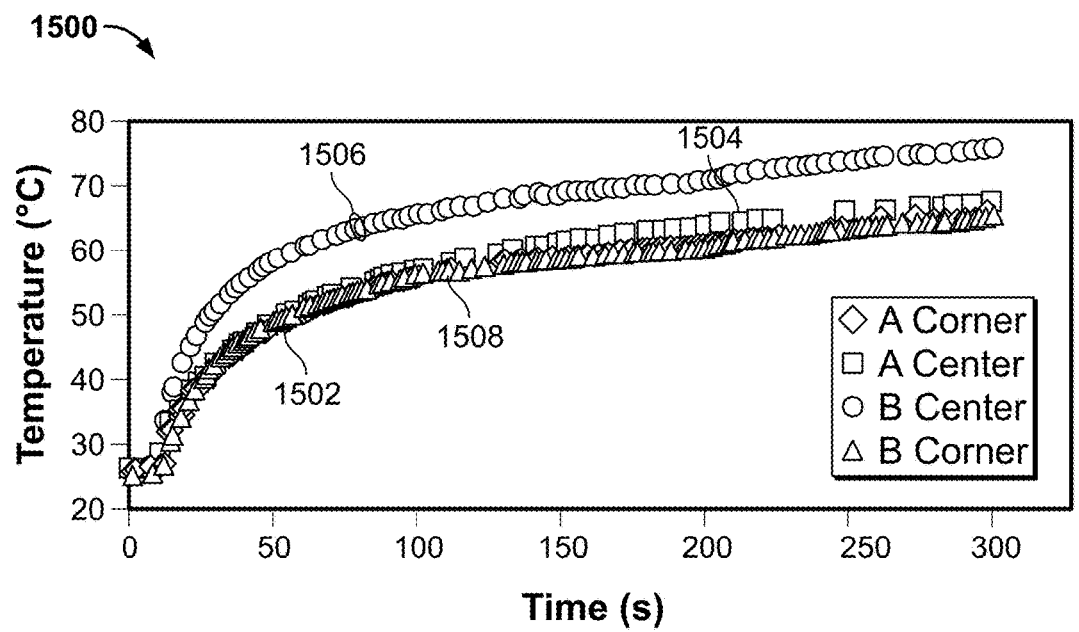
FIG. 15
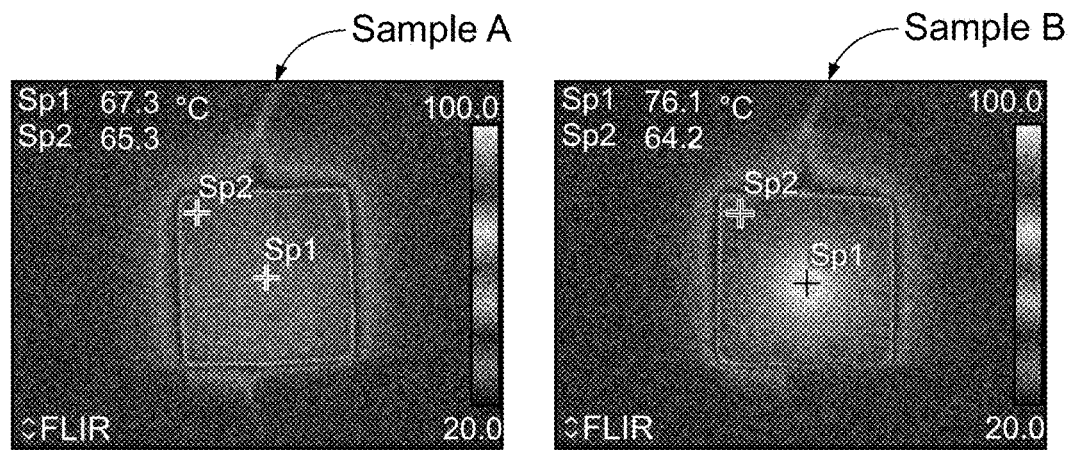
FIG. 16A        FIG. 16B

DEVICES FOR ABSORBING ENERGY FROM ELECTRONIC COMPONENTS

CROSS-REFERENCE TO RELATED APPLICATIONS

This application is a U.S. continuation application that claims priority to and benefit of PCT International Application PCT/US2016/050905 filed Sep. 9, 2016 (published as WO2017/044712 on Mar. 16, 2017), which, in turn, claims priority to and benefit of U.S. Provisional Patent Application No. 62/217,482 filed Sep. 11, 2015. The entire disclosures of the above applications are incorporated herein by reference.

FIELD

The present disclosure relates to devices for absorbing energy from electronic components.

BACKGROUND

This section provides background information related to the present disclosure which is not necessarily prior art.

Electronic devices commonly include one or more devices placed adjacent heat generating components to dissipate heat generated by the components. Typically, this heat is in the form of transient temperature spikes. Often times, one or more heat generating components (and/or other components) in the electronic components may have to decrease their performance (e.g., by a throttling process, etc.) to reduce the amount of heat generated.

DRAWINGS

The drawings described herein are for illustrative purposes only of selected embodiments and not all possible implementations, and are not intended to limit the scope of the present disclosure.

FIG. 1 is a block diagram of an assembly including a thermally conductive layer having a polymer mixture and low melting alloy particulates dispersed in the polymer mixture according to one example embodiment of the present disclosure.

FIG. 2 is a block diagram of an assembly including the thermally conductive layer of FIG. 1 having additional thermally conductive particulates according to another example embodiment.

FIG. 3 is a block diagram of an assembly including a device having a thermally conductive layer, two low melting alloy layers, and two coating layers according to yet another example embodiment.

Figure 4:
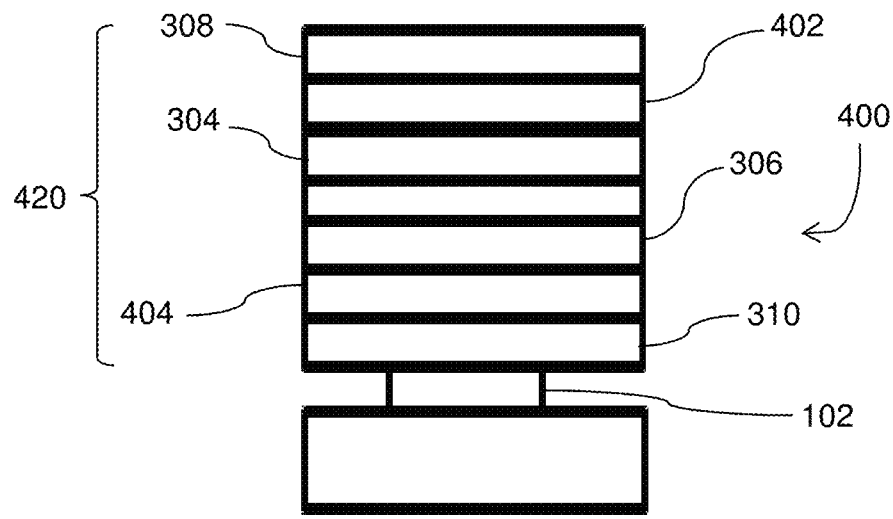
FIG. 4 is a block diagram of an assembly including a device having a thermally conductive layer, two low melting alloy layers, two graphite layers, and two coating layers according to another example embodiment.
Figure 12:
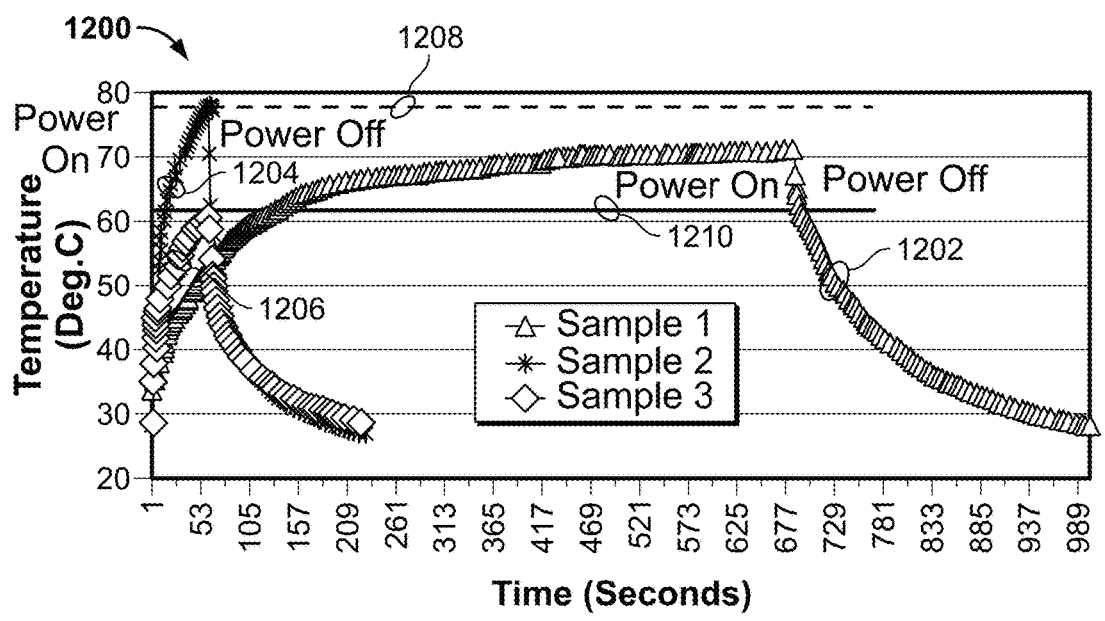
Figure 13:
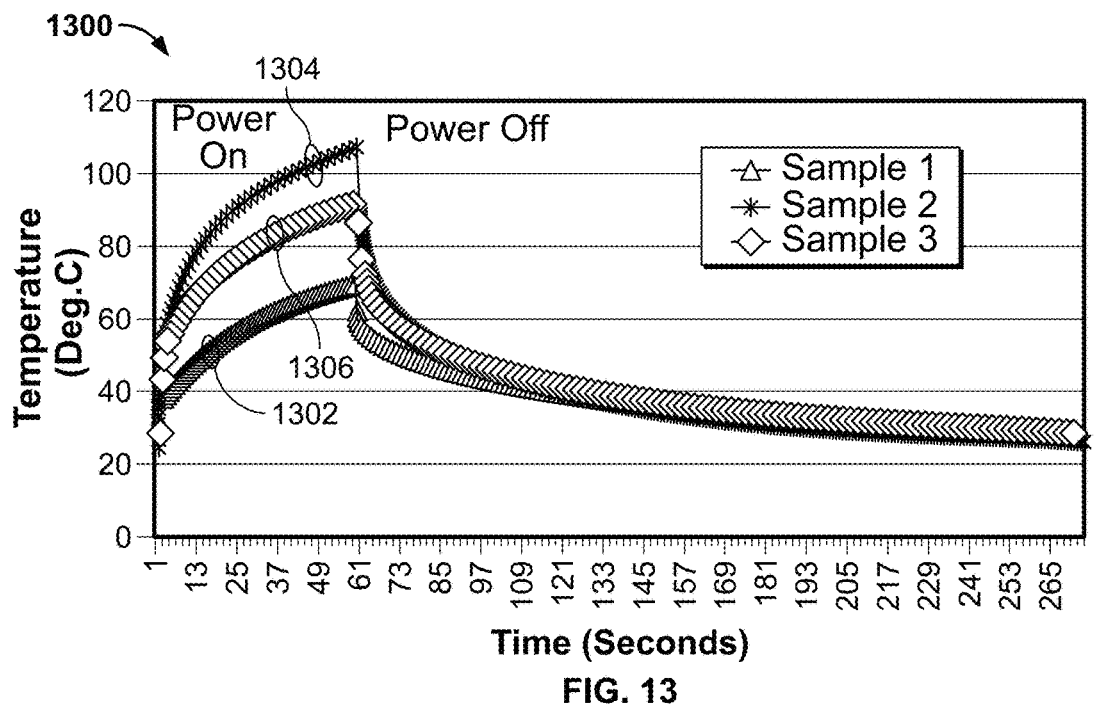
Figure 14:
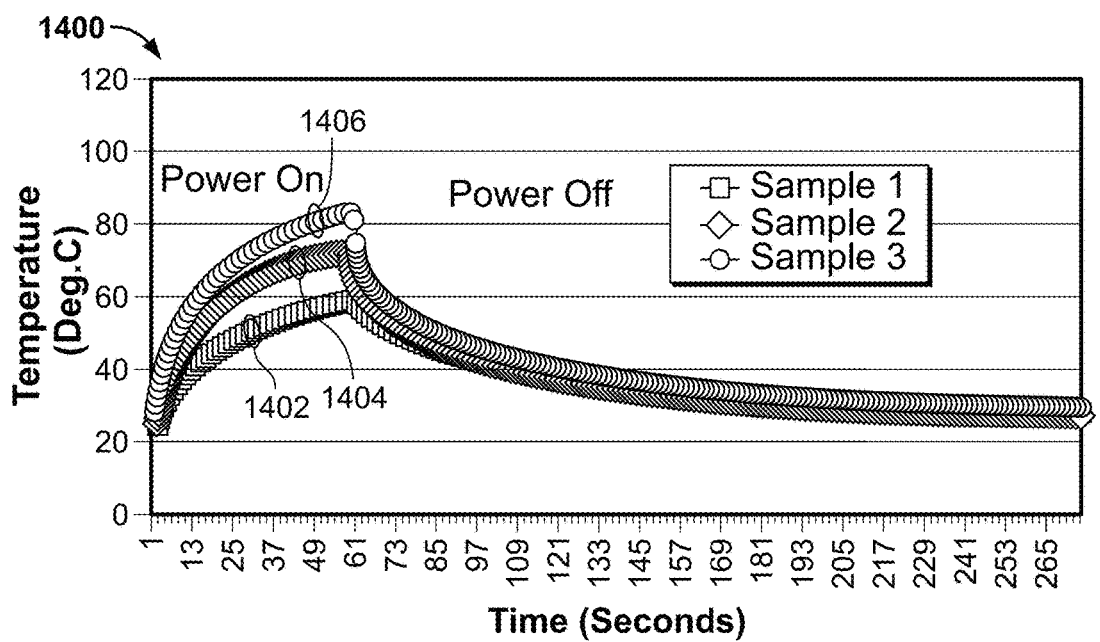

FIGS. 12, 13, and 14 are graphs comparing temperatures of an electronic component with (a) the device of FIG. 4, (b) an air gap, and (c) a known silicone putty.

FIG. 15 is a line graph comparing temperatures of an electronic component with (a) the device of FIG. 4 (collectively "Sample A" shown in FIG. 16A) and (b) a copper foil enveloped with graphite (collectively "Sample B" shown in FIG. 16B).

DETAILED DESCRIPTION

Example embodiments will now be described more fully with reference to the accompanying drawings.

An assembly according to one example embodiment of the present disclosure is illustrated in FIG. 1 and indicated generally by reference number 100. As shown in FIG. 1, the assembly 100 includes an electronic component 102 that generates energy and a thermally conductive layer 104 defined by at least a bottom side 108 coupled to the electronic component 102 and a top side 106. The thermally conductive layer 104 includes a polymer mixture (generally indicated by reference number 110) and low melting alloy particulates (shown as ovals 112) dispersed in the polymer mixture 110. The thermally conductive layer 104 (e.g., a device) absorbs energy generated by the electronic component 102. Additionally, the thermally conductive layer 104 may optionally dissipate at least a portion of the energy it absorbs.

In some embodiments, the thermally conductive layer 104 can absorb and dissipate a sufficient amount of energy without utilizing a dissipating device (e.g., a heatsink, heat pipe, etc.). Thus, and as shown in FIG. 1, the assembly 100 does not include a dissipating device coupled to the top side 106 (or any other side) of the thermally conductive layer 104.

The thermally conductive layer 104 may have any suitable thickness depending on, for example, desired thermal performance, surrounding space restraints, etc. For example, the thermally conductive layer 104 may have a thickness between about 0.05 mm and about 15 mm. In other embodiments, the thickness may be more than about 15 mm or less than 0.05 mm. Additionally, the thickness of the layer 104 (and any other layer disclosed herein) may be uniform or non-uniform.

As shown in FIG. 1, the electronic component 102 is coupled to a substrate 114. For example, the electronic component 102 may be an integrated circuit and the substrate 114 may be a printed circuit board. In other example embodiments, the electronic component 102 may be another suitable electronic component that is or is not coupled to a circuit board and/or another suitable substrate.

In some embodiments, the thermally conductive layer 104 may include one or more other thermally conductive particulates (in addition to the low melting alloy particulates 112) to assist in absorbing, spreading, dissipating, etc. energy. For example, FIG. 2 illustrates an assembly 200 including a thermally conductive layer 204 substantially similar to the thermally conductive layer 104 of FIG. 1. The thermally conductive layer 204 of FIG. 2, however, further includes thermally conductive particulates (shown as rectangles 202) and the low melting alloy particulates 112 dispersed in the polymer mixture 110.

The thermally conductive particulates 202 may be, for example, particles and/or fibers of graphite, metal (including metal alloy), ceramic, and/or a combination thereof. For example, the graphite may be natural graphite, synthetic graphite, a combination of both, the metal may include copper, aluminum, etc., and the ceramic may include aluminum nitride, silicon nitride, etc. Additionally and/or alternatively, the thermally conductive layer 204 may include one or more other suitable thermally conductive particulates without departing from the scope of the present disclosure.

FIG. 3 illustrates another example assembly 300 including the electronic component 102 coupled to the substrate 114 of FIG. 1, and a device 320 for absorbing (and therefore removing) energy from the electronic component 102. As shown in FIG. 3, the device 320 includes an optional thermally conductive layer 302, two low melting alloy layers 304, 306, and two coating layers 308, 310. Each low melting alloy layer 304, 306 includes one side 312, 316 coupled to the thermally conductive layer 302 and another opposing side 314, 318 substantially covered by the coating layers 308, 310, respectively. As such, a cross sectional arrangement of the device 320 includes a coating layer (adjacent the electronic component 102), a low melting alloy layer, an optional thermally conductive layer, another low melting alloy layer, and another coating layer (adjacent a top portion of the device 320).

In the embodiment of FIG. 3, the low melting alloy layers 304, 306 are coated on the thermally conductive layer 302. For example, one or both low melting alloy layers 304, 306 may be molded around the thermally conductive layer 302, soldered to the thermally conductive layer 302, etc. In such examples, each low melting alloy layer 304, 306 has a thickness between about 0.1 mils and about 10 mils. In other embodiments, one or both low melting alloy layers 304, 306 may be placed on the thermally conductive layer 302 in another suitable manner and/or have another suitable thickness depending on, for example, desired results, applications using the device 320, etc.

The low melting alloy layers 304, 306 may include only one or more particular low melting alloys as further explained below. In other example embodiments, one or both low melting alloy layers 304, 306 may include thermally conductive particles blended together with the low melting alloy(s) to enhance thermal conductivity as explained above, a continuous material of higher thermal conductivity (e.g., greater than about 5 w/mK) along with the low melting alloy(s), etc.

One or both low melting alloy layers 304, 306 may melt as the electronic component 102 (and/or an adjacent component) release energy such as heat, waves, etc. as further explained below. For example, if the temperature increases to a melting point temperature (e.g., about 60° C.) of the layer(s) 304, 306, the layer(s) begin to melt and absorb energy from the electronic component 102 (and/or an adjacent component). During this time, the volume of the layer(s) 304, 306 may slightly increase due to, for example, the phase transition.

After the temperature decreases below the melting point temperature of the layer(s) 304, 306, the layer(s) may transfer the absorbed energy to an adjacent layer in the device 300, away from the device 300 (e.g., to an adjacent device), etc. During this time, the volume of the layer(s) 304, 306 may slightly decrease (relative to the volume when melting) due to, for example, the phase transition.

Additionally, the thermal conductivity of the layer(s) 304, 306 may change after the phase transitions. For example, the layer(s) 304, 306 may have a thermal conductivity of about 10 W/mK when the temperature is above their melting point temperature and a thermal conductivity of about 19 W/mK when the temperature is below their melting point temperature.

The thermally conductive layer 302 of FIG. 3 may be a metallic layer, a graphite layer, etc. For example, if the layer 302 is a metallic layer, it may include a foil, a mesh and/or another suitable metallic material. This metallic layer may be formed of copper (including copper alloys), aluminum (including aluminum alloys) and/or another suitable material. In some embodiments, the metallic layer may be formed exclusively of one or more metals (e.g., copper, a copper alloy, etc.), etc.

In the particular example of FIG. 3, the thermally conductive layer 302 has a thickness between about 1 mil and about 2 mils. In other embodiments, the thickness of the thermally conductive layer 302 may be more than 2 mils or less than 1 mil. For example, the thickness of the thermally conductive layer 302 may be about 0.25 mils, about 2.5 mils, about 2.9 mils, etc.

As explained above, each coating layers 308, 310 may substantially cover its corresponding low melting alloy layer 304, 306. For example, the coating layer 308 may entirely cover the side 314 of the low melting alloy layer 304 and the coating layer 310 may entirely cover the side 318 of the low melting alloy layer 306.

In other embodiments, the coating layers 308, 310 may encapsulate at least a portion of the device 320. For example, the coating layer 308 may extend beyond the side 314 of the low melting alloy layer 304 and downward towards the electronic component 102. In such cases, the coating layer 308 may cover one or both peripheral sides of the low melting alloy layer 304 and optionally one or both peripheral sides of the thermally conductive layer 302. Similarly, the coating layer 310 may extend beyond the side 318 of the low melting alloy layer 306. In some embodiments, the coating layers 308, 310 may form one coating layer encapsulating the entire device 320.

Additionally and/or alternatively, the low melting alloy layer 306 and/or the low melting alloy layer 304 may be at least partially exposed. Thus, in some examples, the coating layer 308 and/or the coating layer 310 may not be employed. In other examples, one or both coating layers 308, 310 may cover less than the entire surface area of the sides 314, 318 of one or both low melting alloy layers 304, 306. For example, the coating layer 310 may cover less than the entire side 318 of the low melting alloy layer 306. In such examples, the coating layer 310 may cover the portion of the side 318 aligned with the electronic component 102).

Each coating layer 308, 310 may be formed of any suitable material. For example, one or both of the coating layers 308, 310 may be thermally and/or electrically insulating, thermally and/or electrically conductive, etc. For example, the coating layer(s) 308, 310 can be isotopically insulating having a thermal conductivity of about 0.02 W/mK, isotopically thermally conductive having a thermal conductivity of up to about 400 W/mK, anisotropically thermally conductive having a through-plane (z axis) thermal conductivity between about 2 W/mK and about 16 W/mK and an in-plane (x, y axis) thermal conductivity between about 100 and about 1900 w/mK, etc.

As such, one or both coating layers 308, 310 may include plastic, a thermally conductive material, etc. For example, the layer(s) 308, 310 may include metal, ceramic, graphite, etc. at least partially coated with plastic (if desired). In some embodiments, the thermally conductive material may be enveloped in plastic. Additionally, the layer(s) 308, 310 may be scratch resistant if desired.

Additionally, the coating layer(s) 308, 310 may be flexible. Thus, the layer(s) 308, 310 may be conformable to mate with their adjacent layer (if applicable). Additionally, an adhesive may be placed between the coating layer(s) 308, 310 and their adjacent layer (e.g., the low melting alloy layer(s) 304, 306 of FIG. 3). In some examples, the adhesive may be a thermally conductive adhesive.

In some embodiments, the device 320 (and/or another device disclosed herein) may include one or more additional thermally conductive layers for absorbing, spreading, dissipating, etc. energy. For example, FIG. 4 illustrates an assembly 400 including a device 420 substantially similar to the device 320 of FIG. 3. The device 420 of FIG. 4, however, further includes a thermally conductive layer positioned between a coating layer and a low melting alloy layer.

In the particular example of FIG. 4, the device 420 includes a thermally conductive layer 402 formed of graphite positioned between the coating layer 308 and the low melting alloy layer 304, and a thermally conductive layer 404 formed of graphite positioned between the coating layer 310 and the low melting alloy layer 306. As such, a cross sectional arrangement of the device 420 includes a coating layer (adjacent the electronic component 102), a graphite layer, a low melting alloy layer, a thermally conductive layer, another low melting alloy layer, another graphite layer, and another coating layer (adjacent a top portion of the device 420).

The graphite layers 402, 404 may assist in spreading energy absorbed from the electronic component 102. For example, each graphite layer 402, 404 may be anisotropic in that its in-plane thermal conductivity (e.g., the plane parallel to top and bottom sides) may be larger than its through-plane thermal conductivity (e.g., the plane perpendicular to the top and bottom sides). This causes a greater amount of energy to spread through the in-plane of each graphite layer 402, 404 as compared to the through-plane.

Additionally, the graphite layers 402, 404 may assist in absorbing and dissipating energy. For example, the graphite layer 404 may absorb energy from the electronic component 102 (via, e.g., the coating layer 310) and dissipate energy into the low melting alloy layer 306. This dissipation of energy may be spread across top side of the graphite layer 404 due to the anisotropic relationship as explained above. In some embodiments, one or both of the low melting alloy layers 304, 306 may be absorbed into the graphite layers 402, 404 to promote this transfer of energy The graphite layers 402, 404 may be formed of natural graphite and/or synthetic graphite. For example, the graphite layer 402 may be formed of natural graphite and the graphite layer 404 may be formed of synthetic graphite. The graphite layers may include, for example, sheets of graphite such as flexible graphite sheets having exfoliated natural graphite flakes, synthetic graphite sheets, etc. In such examples, one or both coating layers 308, 310 may substantially prevent the graphite from flaking off the graphite layers 402, 404. The synthetic graphite may include pyrolytic graphite or another suitable synthetic graphite material.

One or both graphite layers 402, 404 may have a thickness between about 0.014 mm and about 1 mm, one or both low melting alloy layers 304, 306 of FIG. 4 may have a thickness between about 0.0025 mm and about 0.5 mm, and one or both coating layers 308, 310 of FIG. 4 may have a thickness between about 0.0025 mm and about 0.5 mm. In other example embodiments, any one or more of the layers may have another suitable thickness depending on, for example, desired thermal performance, surrounding space restraints, etc.

Figure 7:
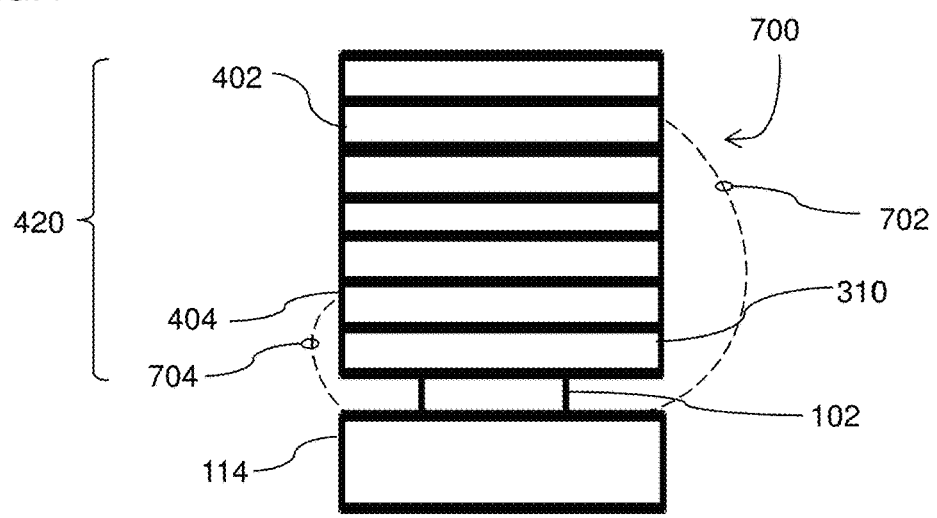
FIG. 7 is a block diagram of an assembly including the device of FIG. 4 in which the graphite layers are coupled to a reference potential according to yet another example embodiment.

In some embodiments, one or both graphite layers 402, 404 may provide shielding of the electronic component 102 (if applicable) due to the electrical conductivity of the graphite layers 402, 404. For example, FIG. 7 illustrates an assembly 700 including the device 420 of FIG. 4, in which the graphite layers 402, 404 are formed of one or more graphite sheets and the sheets are coupled to a reference potential (e.g., ground on the substrate 114). As a result, the graphite layer(s) 402, 404 may provide shielding (e.g., electromagnetic interference shielding, etc.) of the electronic component 102.

In the example embodiment of FIG. 7, the graphite layers 402, 404 are coupled to the reference potential on the substrate 114 via electrical conductors 702, 704 (shown as dashed lines), respectively. For example, one or more terminals (such as pins, hooks, etc.), a conductive adhesive (such as solder, etc.), etc. can be employed to couple the electrical conductors 702, 704 to the graphite layers 402, 404 and/or the substrate 114.

In some embodiments, only one of the graphite layers 402, 404 may be coupled to the reference potential on the substrate 114. For example, the graphite layer 404 may be coupled to the reference potential (via the electrical conductor 704) and the graphite layer 402 may not be coupled to the reference potential.

As shown in FIG. 7, the device 420 can be a standalone device. In such examples, the device 420 can be positioned on the electronic component 102 without additional shielding devices as shown in FIG. 7. In some standalone devices, each side of the graphite layer 404 (and optionally the coating layer 310) can extend downward towards the substrate 114 a distance substantially equal to a height of the electronic component 102. As such, when the device 420 is positioned adjacent the electronic component 102, the downward extending sides (not shown) of the graphite layer 404 can be substantially flush with the substrate 114 to substantially surround the electronic component 102.

Figure 8:
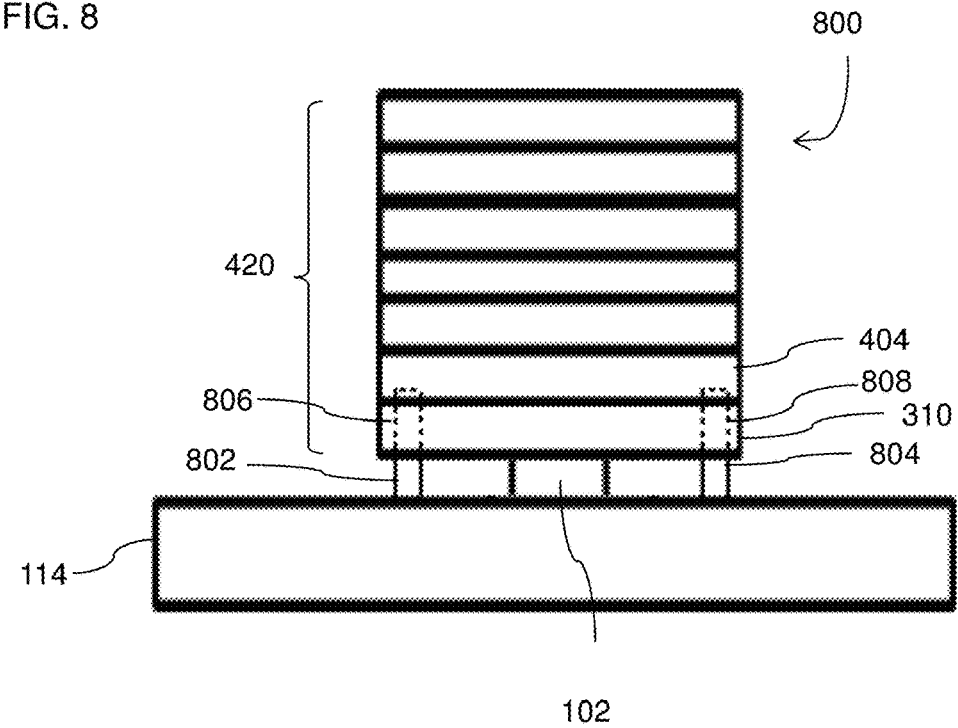
FIG. 8 is a block diagram of an assembly including the device of FIG. 4 in which one of the graphite layers is coupled to a reference potential according to another example embodiment.

Alternatively, the device 420 can attach to a board level shielding (BLS) device. For example, the device 420 can couple to a lid of a BLS device. In other example embodiments, the device 420 can replace a lid of a BLS device. For example, FIG. 8 illustrates an example assembly 800 including the device 420 of FIG. 4 having the graphite layer 404 coupled to portions 802, 804 of a BLS device positioned on the substrate 114. In the particular example of FIG. 8, the graphite layer 404 is formed of one or more graphite sheets, the device 420 is a lid of the BLS device, and the portions 802, 804 are two opposing sides (e.g., of a fence) of the BLS device surrounding the electronic component 102.

As shown in FIG. 8, when the device 420 is positioned adjacent the electronic component 102, at least a part 806, 808 of the fence portions 802, 804 pierces through (and penetrates) the coating layer 310 and couples to the graphite layer 404. This may allow the graphite layer 404 to couple to a reference potential on the substrate 114 via the portions 802, 804. Thus, in the example embodiment of FIG. 8, the graphite layer 404 is providing shielding of the electronic component 102.

Additionally, and as shown in FIG. 8, the portions 802, 804 of the BLS device may pierce into the graphite layer 404. In other embodiments, the portions 802, 804 may couple to a bottom side of the graphite layer 404. In either case, a conductive adhesive (e.g., solder, etc.) may be used to ensure the shielding fence and the graphite layer 404 are in sufficient contact.

Figure 9:
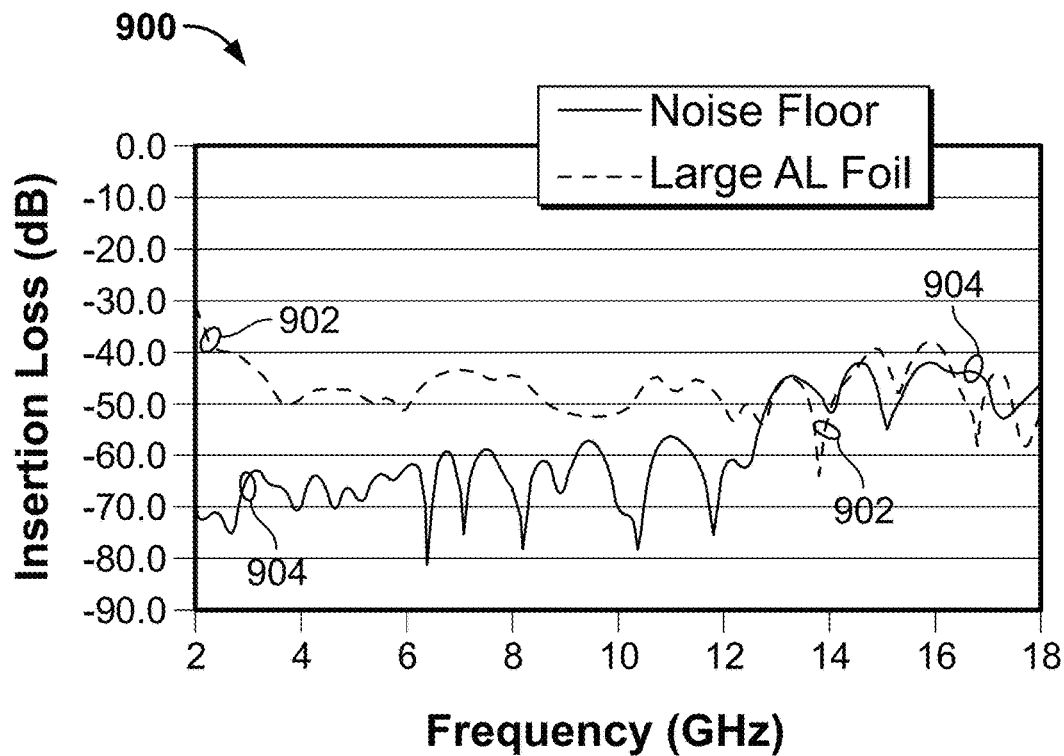
FIG. 9 is a graph comparing an insertion loss for a traditional aluminum foil material and a noise floor.
Figure 10:
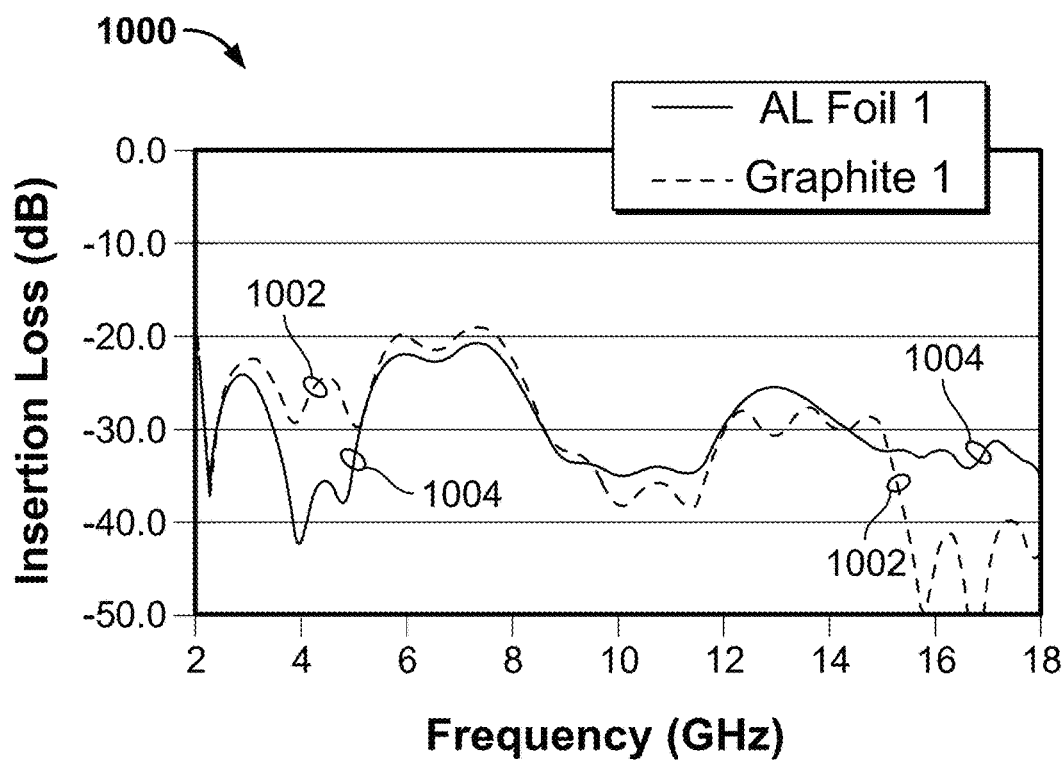
FIG. 10 is a graph comparing an insertion loss for a single synthetic graphite sheet and a single aluminum foil sheet.
Figure 11:
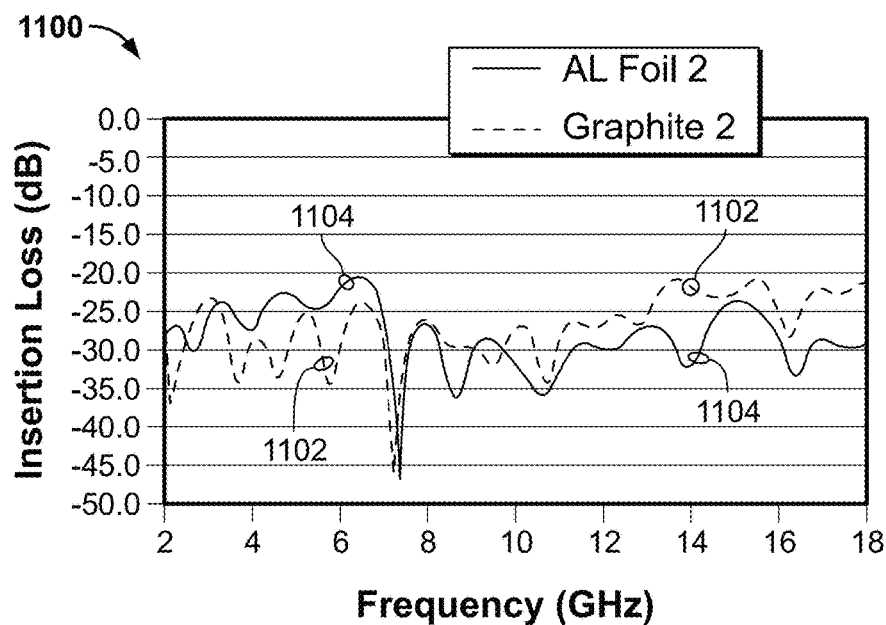
FIG. 11 is a graph comparing an insertion loss for two synthetic graphite sheets and two aluminum foil sheets.

Testing has shown that shielding performance of graphite sheets is comparable to other typical shielding materials. For example, FIGS. 9-11 illustrate graphs 900, 1000, 1100 comparing shielding performance of synthetic graphite sheet(s), an aluminum foil material, and/or a noise floor. In particular, the graph 900 of FIG. 9 compares an insertion loss in decibels (dBs) between a traditional aluminum foil material (indicated by line 902) and a noise floor (indicated by line 904) between 2 GHz and 18 GHz to calibrate the testing fixture. The traditional aluminum foil material is a two feet by two feet aluminum foil sheet. The difference between the line 902 and the line 904 is indicative of energy leaking around the aluminum foil sheet.

The graph 1000 of FIG. 10 compares an insertion loss in dBs between a single synthetic graphite sheet (indicated by line 1002) and a single aluminum foil sheet (indicated by line 1004) while the graph 1100 of FIG. 11 compares an insertion loss in dB s between two side by side synthetic graphite sheets (indicated by line 1102) and two side by side aluminum foil sheets (indicated by line 1104). The sheets used for the testing shown in FIGS. 10 and 11 are seven inches by eight inches. As shown in FIGS. 10 and 11, the insertion loss of the synthetic graphite sheet(s) is similar to the insertion loss of the aluminum foil sheet(s). Thus, an estimated shielding performance of the synthetic graphite sheet(s) is similar to the aluminum foil sheet(s) between at least the 2 GHz and 18 GHz frequency range. Additionally, comparable shielding performance may be seen in some cases below 2 GHz and above 18 GHz.

Figure 5:
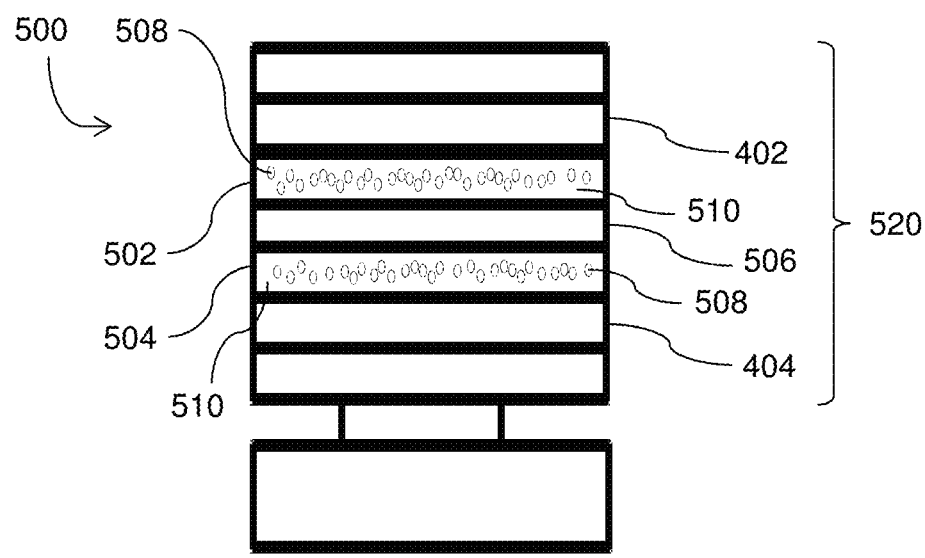
FIG. 5 is a block diagram of an assembly including a device having a thermally conductive layer, two low melting alloy layers each having a polymer mixture and low melting alloy particulates dispersed in the polymer mixture, two graphite layers, and two coating layers according to yet another example embodiment.

Referring back to FIG. 4, the device 420 may include a low melting alloy layer having a polymer mixture and low melting alloy particulates dispersed in the polymer mixture in addition to or instead of one or both of the low melting alloy layers 304, 306. For example, FIG. 5 illustrates an assembly 500 including a device 520 substantially similar to the device 420 of FIG. 4. The device 520 of FIG. 5, however, includes a low melting alloy layer having a polymer mixture and low melting alloy particulates positioned between a thermally conductive layer and a graphite layer.

In the particular example of FIG. 5, the device 520 includes a low melting alloy layer 502 positioned between a thermally conductive layer 506 and the graphite layer 402, and a low melting alloy layer 504 positioned between the thermally conductive layer 506 and the graphite layer 404. Thus, the low melting alloy layers 502, 504 are coupled to opposing sides of the thermally conductive layer 506.

As shown in FIG. 5, each low melting alloy layer 502, 504 includes a polymer mixture (generally indicated by reference number 510) and low melting alloy particulates (shown as ovals 508) dispersed in the polymer mixture 510. The polymer mixture 510 and the low melting alloy particulates 508 may be the substantially similar to the polymer mixture 110 and the low melting alloy particulates 112, respectively, of FIGS. 1 and 2.

Additionally, one or both low melting alloy layers 502, 504 may optionally include other thermally conductive particulates (not shown in FIG. 5) dispersed in the polymer mixture 510 in addition to the low melting alloy particulates 508. These additional thermally conductive particulates may be substantially similar to the thermally conductive particulates 202 of FIG. 2. As such, the thermally conductive particulates may be, for example, particles and/or fibers of graphite, metal (including metal alloy), ceramic, and/or a combination thereof.

The thermally conductive layer 506 may be a metallic layer, a graphite layer, or another suitable thermally conductive layer. Additionally, the particular thermally conductive layer 506 of FIG. 5 has a thickness between about 0.00625 mm (6.25 um) and about 1 mm. For example, if the thermally conductive layer 506 is a graphite layer, the thickness of the thermally conductive layer may have a thickness between about 0.025 mm and about 0.25 mm. In other example embodiments, the thermally conductive layer 506 may have another suitable thickness.

Further, one or both low melting alloy layers 502, 504 of FIG. 5 may have any suitable thickness. For example, if the thermally conductive layer 506 is a metallic layer, one or both low melting alloy layers 502, 504 can have a thickness between about 0.1 mils and about 10 mils.

The thermally conductive layer 506 of FIG. 5 may be formed of any suitable thermally conductive material. For example, the thermally conductive layer 506 may be formed of graphite (as explained above). In such examples, the device 520 may include multiple graphite layers (e.g., the thermally conductive layer 506, the graphite layers 402, 404, etc.) that may provide shielding as explained above. In other embodiments, the thermally conductive layer 506 may be a metallic layer substantially similar to the thermally conductive layer 302 of FIG. 3.

Although the devices disclosed herein include a particular number of layers in a particular order, it should be understood that one or more layers may be omitted, added, and/or positioned in a different order if desired. For example, although the device 320 of FIG. 3 includes one thermally conductive layer 302, two low melting alloy layers 304, 306, and two coating layers 308, 310 in a sandwich like configuration, the device 320 may include one low melting alloy layer, and two coating layers on each side of the low melting alloy layer. In other embodiments, the device 320 may include two thermally conductive layers, three low melting alloy layers, and two coating layers.

In addition, and as explained herein, any one of the layers disclosed herein may be coupled to its adjacent layer. For example, one layer may be coupled to another layer via an adhesive (e.g., solder), etc. Other layers may be laminated together, melt coated together, etc.

Additionally, any one of the devices (including the thermally conductive layer 104) may be coupled (e.g., thermally coupled) to its respective electronic component and/or another device such as a heatsink, heat pipe, etc. (if applicable) via an interface. For example, the thermally conductive layer 104 of FIG. 1 may be coupled to the electronic component 102 via a thermal grease or another suitable thermal interface. In other embodiments, an adhesive (e.g., solder, tape, etc.) may be positioned between the device and the electronic component.

Figure 6:
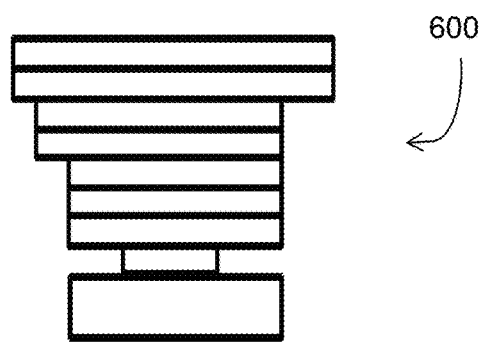
FIG. 6 is a block diagram of an assembly including a device having layers of different widths according to another example embodiment.

Further, although the devices disclosed herein have one or more layers including the same width, it should be understood that any one of the devices may include layer(s) having different widths. For example, FIG. 6 illustrates a device 600 substantially similar to the assemblies 400 and 500 of FIGS. 4 and 5, but including layers of different widths. These widths may be dependent on, for example, the available space in a system including the device, thermal characteristics of one or more of the layers, desired thermal results, etc.

The polymer mixtures disclosed herein (e.g., the polymer mixture 110 of FIG. 1) may include a crosslinked polymer such as crosslinked silicone, epoxy, polyurethane or another suitable crosslinked polymer.

The low melting alloy particulates disclosed herein (e.g., the particulates 112 of FIG. 1, the particulates 508 of FIG. 5, etc.) and the low melting alloy layers disclosed herein (e.g., the layer(s) 304, 306 of FIG. 3, the layer(s) 502, 504 of FIG. 5, etc.) may be formed of any suitable low melting alloy. In some examples, the low melting alloy particulates may be formed of a low melting alloy that melts at or below about 160° C. and the low melting alloy layers may be formed of a low melting alloy that melts at or below about 60° C.

For example, the low melting alloy particulates/layers may be formed of gallium, indium (29.6 In, 33 In, 52 In, 66.3 In, etc.), bismuth (33.7 Bi, 35.5 Bi, 54.1 Bi, 67 Bi, etc.), tin (16.3 Sn, 16.5 Sn, etc.), etc. In some example embodiments, the low melting alloy particulates/layers are preferably formed of eutectic materials. In other example embodiments, cadmium or lead are not used to form the particulates/layers. Generally, the low melting alloy(s) that form the particulates/layers have a density greater than or equal to about 6.0 g/cc.

The particulates disclosed herein may be dispersed in the polymer mixtures by high speed dispersing, ultrasonic mixing, centrifugal mixing, planetary mixing, shaking, sonication, or another suitable dispersion process. Additionally, the particulates may be dispersed as a preformed powder having substantially spherical particles. In other example embodiments, a low melting alloy may be melted while in the polymer mixture (as explained above) and then subjected to shear by high speed mixing, ultrasonic mixing, etc. to create the individual particulates (which solidify discretely upon cooling).

The polymer mixtures may include any suitable weight percent of the low melting alloy particulates disclosed herein. For example, if the thermally conductive layer 506 of FIG. 5 is a metallic layer (as explained above), one or both low melting alloy layers 502, 504 of FIG. 5 can have about a five weight percent or more of the low melting alloy particulates 508. In other embodiments, the polymer mixtures may include particulates having between about five weight percent and ninety-eight weight percent. For example, the particulates 112 of FIG. 2 may have about 60 weight percent and the particulates 202 of FIG. 2 may have about 35 weight percent.

As used herein, energy may refer to heat generated by an electronic component and/or adjacent components due to, for example, current flowing through the electronic component and/or adjacent components, etc. Additionally and/or alternatively, energy may refer to waves (e.g., electromagnetic waves, etc.) emitted from an electronic component and/or adjacent components.

By employing the devices disclosed herein, energy from transient temperature spikes in an electronic component may be absorbed, spread, dissipated, etc. more effectively than traditional designs including, for example, paraffin wax designs, etc. As such, this energy that may otherwise cause damaging effects to components in an electronic device, to a user holding the electronic device, etc. may be managed without, for example, decreasing performance of integrated circuits and/or other electronic components (e.g., by a throttling process, etc.) to reduce the amount of energy generated.

For example, FIGS. 12-15 illustrate graphs 1200, 1300, 1400, 1500 showing various test results of the device 420 of FIG. 4 compared to known designs. The graph 1200 of FIG. 12 illustrates a comparison of heat management between an electronic component with (a) the device 420 (collectively "Sample 1"), (b) an air gap (collectively "Sample 2"), and (c) a known silicone putty having a ceramic filler (collectively "Sample 3"). The temperature of Sample 1, Sample 2, and Sample 3 are represented by lines 1202, 1204, 1206, respectively.

During testing, Sample 1 (e.g., the electronic component) was powered at 0.5 W for 11 minutes (660 seconds) while Sample 2 and Sample 3 were powered at 0.5 W for 60 seconds. As shown in FIG. 12, the temperature of Sample 1 does not reach the maximum temperature (about 77° C.) of Sample 2 before powering off during the 11 minute test. Additionally, and as shown in FIG. 12, about 130 seconds passes before Sample 1 reaches the maximum temperature (about 61° C.) of Sample 3. The maximum temperature of Sample 2 and Sample 3 are represented by lines 1208, 1210, respectively.

The graph 1300 FIG. 13 illustrates a comparison of heat management between Sample 1, Sample 2, and Sample 3 when each was powered at 1.0 W for 60 seconds. The temperature of Sample 1, Sample 2, and Sample 3 are represented by lines 1302, 1304, 1306, respectively.

As shown in FIG. 13, the temperature of Sample 1, Sample 2, and Sample 3 (at 60 seconds) are 68.51° C., 106.68° C. and 90.95° C., respectively. Thus, Sample 1 reduces temperature by about 38° C. relative to Sample 2 (the air gap sample) while Sample 3 reduces temperature by about 16° C. relative to Sample 2.

The graph 1400 of FIG. 14 illustrates a comparison of heat management between Sample 1, Sample 2, and Sample 3 each including a BLS device. For example, Sample 1 includes the electronic component and the device 420 as explained above, and a BLS device surrounding the electronic component and the device 420. Each sample was powered at 1.0 W for 60 seconds. The temperature of Sample 1, Sample 2, and Sample 3 of FIG. 14 are represented by lines 1402, 1404, 1406, respectively.

As shown in FIG. 14, the temperature of Sample 1, Sample 2, and Sample 3 (at the 60 second mark) are 57.96° C., 71.29° C., and 82.67° C., respectively. Thus, Sample 1 reduces temperature by about 13° C. relative to Sample 2 (the air gap sample) while Sample 3 increases temperature by about 11° C. relative to Sample 2.

The line graph 1500 of FIG. 15 illustrates a comparison of heat management between an electronic component with (a) the device 420 (collectively "Sample A" shown in FIG. 16A) and (b) a copper foil enveloped with graphite (collectively "Sample B" shown in FIG. 16B). The line graph 1500 illustrates temperatures of the electronic component adjacent a corner of Sample A (line 1502), a center of Sample A (line 1504), a center of Sample B (line 1506), and a corner of Sample B (line 1508). Each sample has a dimension of 4 cm by 4 cm by 0.02 cm.

As shown in FIGS. 15 and 16A, the temperature (at about 300 seconds) adjacent the center of Sample A is about 67.3° C. and the corner of Sample A is about 65.3° C. The temperature (at about 300 seconds) adjacent the center of Sample B is about 76.1° C. and the corner of Sample B is about 64.2° C. as shown in FIGS. 15 and 16B. Thus, Sample A (including device 420 of FIG. 4) has a more uniform temperature than Sample B. As such, heat spreading across the in-plane of the device 420 of Sample A is greater than the copper foil device of Sample B.

Additionally, the device 420 and the electronic component of Sample A have a lower temperature than the copper foil device and the electronic component of Sample B.

Further, testing has shown Sample A absorbs a larger amount of heat than Sample B at 65° C.

Further, by employing the devices having a polymer mixture layer (e.g., the thermally conductive layer 104 of FIG. 1, the thermally conductive layer 204 of FIG. 2, the low melting alloy layers 502, 504 of FIG. 5, etc.), the devices may experience increased compliancy that can improve conformability to a mating surface, reduce contact resistance between surfaces, and increase tolerance of height variation in particular applications using the device.

In addition, the devices including graphite layers as disclosed herein may provide shielding in addition to the improved energy performance as explained above. In some cases, these devices may weigh less, use less substrate space, and be more flexible than traditional rigid shielding devices. For example, graphite can weigh between about twenty percent and three hundred percent less than typical shielding materials (e.g., stainless steel, aluminum, etc.) while having thermal conductivities from about four times to more than a hundred times higher than typical shielding materials. Additionally, an overall cost of providing shielding and thermal management may decrease compared to known devices as both functions can be combined into one device. Thus, using devices including graphite layers to replace typical board level shields may improve thermal performance, cost less, reduce weight of a product including the device, and reduce space required by shielding components, all while maintaining an effective shielding performance as explained above.

Further, the devices disclosed herein may be employed in various electronic devices including for example, smart phones, tablets, etc. For example, the devices may be utilized in electronics board level applications to absorb energy for a duration of time thereby reducing temperature on (and/or adjacent to) integrated circuits or other electronic components in an electronic device. The devices may also spread and/or transfer energy as explained herein.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An assembly comprising:
   an electronic component on a substrate;
   a board level shield including a fence coupled to the substrate and surrounding the electronic component; and
   a device for absorbing energy from an electronic component, the device comprising:
      a low melting alloy layer including a first side and a second side opposing the first side, the low melting alloy layer includes a polymer mixture and a plurality of low melting alloy particulates dispersed in the polymer mixture,
      a first coating layer substantially covering the first side of the low melting alloy layer and/or adjacent a top portion of the device,
      a second coating layer substantially covering the second side of the low melting alloy layer and/or positionable adjacent the electronic component, and
      at least one thermally conductive layer coupled between the low melting alloy layer and one of the first or second coating layer;
   wherein the device is a lid of the board level shield when coupled to the fence and positioned adjacent and over the electronic component, such that one or more portions of the fence pierce through, penetrate through, and/or pass the second coating layer and couple with at least another portion of the device; and
   wherein:
      the low melting alloy layer is a first low melting alloy layer, and the device further comprises a second low melting alloy layer coupled to the thermally conductive layer; or
      the thermally conductive layer is a first thermally conductive layer, and the device further comprises at least a second thermally conductive layer formed of graphite.

2. The assembly of claim 1, wherein the polymer mixture comprises a crosslinked polymer including silicone, epoxy, or polyurethane, and wherein the low melting alloy particulates dispersed in the polymer mixture comprise gallium, indium, or bismuth.

3. The assembly of claim 1 wherein the low melting alloy layer is the first low melting alloy layer, and the assembly further comprises the second low melting alloy layer coupled to the thermally conductive layer.

4. The assembly of claim 1 wherein the thermally conductive layer is the first thermally conductive layer, and the device further comprises the second thermally conductive layer formed of graphite.

5. The assembly of claim 1 wherein:
   the low melting alloy layer is the first low melting alloy layer, and the device further comprises the second low melting alloy layer coupled to the thermally conductive layer;
   the thermally conductive layer is the first thermally conductive layer that is formed of graphite and that is coated with the first coating layer to substantially prevent the graphite from flaking off; and
   the device further comprises the second thermally conductive layer formed of graphite that is coated with the second coating layer to substantially prevent the graphite from flaking off.

6. The assembly of claim 1, wherein the low melting alloy layer is the first low melting alloy layer, and the device further comprises the second low melting alloy layer including a polymer mixture and a plurality of low melting alloy particulates dispersed in the polymer mixture.

7. The assembly of claim 6, further comprising at least one thermally conductive layer coupled between the first low melting alloy layer and the second low melting alloy layer.

8. The assembly of claim 7, wherein the thermally conductive layer coupled between the first low melting alloy layer and the second low melting alloy layer is formed of graphite.

9. The assembly of claim 8, wherein the thermally conductive layer coupled between the first low melting alloy layer and the second low melting alloy layer is configured to couple to a reference potential and provide shielding of the electronic component.

10. The assembly of claim 7, wherein the thermally conductive layer coupled between the first low melting alloy layer and the second low melting alloy layer is a metallic layer.

11. The assembly of claim 10, wherein the first low melting alloy layer has about a five weight percent or more of the plurality of low melting alloy particulates and/or wherein the first low melting alloy layer has a thickness between about 0.1 mils and about 10 mils.

12. The assembly of claim 1, wherein the lid of the board level shield is coupled to the fence and positioned adjacent and over the electronic component, and the one or more portions of the fence have pierced through and penetrated the second coating layer and are coupled with at least another portion of the device.

13. A device for absorbing energy from an electronic component, the device comprising:
   a first thermally conductive layer including a first side and a second side opposing the first side;
   two or more low melting alloy layers, one low melting alloy layer coupled to the first side of the first thermally conductive layer, another low melting alloy layer coupled to the second side of the first thermally conductive layer;
   two or more graphite layers, one graphite layer coupled to said one low melting alloy layer, another graphite layer coupled to said another low melting alloy layer; and two or more coating layers, one coating layer substantially covering one side of said one graphite layer, another coating layer substantially covering one side of said another graphite layer;

wherein the device is configured to be attached to a fence of a board level shield that is coupled to a substrate and surrounding the electronic component, such that the device is operable a lid of the board level shield and one or more portions of the fence pierce through, pass, and/or penetrate at least one of the coating layers and couple to at least one of the graphite layers.

14. The device of claim 13, wherein at least one of the low melting alloy layers includes a polymer mixture and a plurality of low melting alloy particulates dispersed in the polymer mixture.

15. The device of claim 13, wherein the first thermally conductive layer is formed of graphite.

16. The device of claim 13, wherein the first thermally conductive layer is a metallic layer.

17. The device of claim 13, wherein the at least one of the graphite layers is configured to couple to a reference potential on the substrate via the one or more portions of the fence and provide shielding of the electronic component.

18. An assembly including the electronic component on the substrate and the board level shield, wherein the board level shield includes:
the fence coupled to the substrate and surrounding the electronic component; and
the device of claim 13 coupled to the fence and positioned adjacent and over the electronic component, such that the one or more portions of the fence pierce through and penetrate the at least one of the coating layers and couple to the at least one of the graphite layers, which thereby allows the at least one of the graphite layers to couple to a reference potential on the substrate via the one or more portions of the fence.

19. An assembly comprising:
an electronic component on a substrate; and
a board level shield including a fence coupled to the substrate and surrounding the electronic component and a lid coupled to the fence, whereby the board level shield is operable for providing shielding of the electronic component;

wherein the lid comprises:
a thermally conductive layer, the thermally conductive layer including a polymer mixture and a plurality of low melting alloy particulates dispersed in the polymer mixture;
a first coating layer;
a second coating layer;
a first graphite layer between the thermally conductive layer and the first coating layer, the first coating layer configured to substantially prevent graphite from flaking off the first graphite layer;
a second graphite layer between the thermally conductive layer and the second coating layer, the second coating layer configured to substantially prevent graphite from flaking off the second graphite layer;

wherein one or more portions of the fence pierce through, pass, and/or penetrate the second coating layer and couple to the second graphite layer, which thereby allows the second graphite layer to couple to a reference potential on the substrate via the one or more portions of the fence.

20. The assembly of claim 19, wherein:
the thermally conductive layer is configured to dissipate the absorbed energy without a dissipating device coupled to the thermally conductive layer; and
the low melting alloy particulates are a first plurality of thermally conductive particulates and wherein the thermally conductive layer includes a second plurality of thermally conductive particles dispersed in the polymer mixture different than the first plurality of thermally conductive particulates.

* * * * *